(12) United States Patent
Polishchuk et al.

(10) Patent No.: US 7,880,219 B2
(45) Date of Patent: Feb. 1, 2011

(54) NONVOLATILE CHARGE TRAP MEMORY DEVICE HAVING <100> CRYSTAL PLANE CHANNEL ORIENTATION

(75) Inventors: Igor Polishchuk, Fremont, CA (US); Sagy Levy, Sunnyvale, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 331 days.

(21) Appl. No.: 11/904,470

(22) Filed: Sep. 26, 2007

(65) Prior Publication Data

US 2008/0290398 A1 Nov. 27, 2008

Related U.S. Application Data (60) Provisional application No. 60/940,183, filed on May 25, 2007.

(51) Int. Cl.
*H01L 29/792* (2006.01)
(52) U.S. Cl. .............. 257/324; 257/411; 257/E29.309; 257/E21.18; 438/287; 438/288
(58) Field of Classification Search ................ 257/324, 257/411, E29.309, E21.18; 438/287, 288
See application file for complete search history.

(56) References Cited

U.S. PATENT DOCUMENTS

| 7,087,477 | B2 | 8/2006 | Fried et al. |
| 7,199,426 | B2 | 4/2007 | Ogura et al. |
| 2002/0045324 | A1* | 4/2002 | Ding ........................... 438/424 |
| 2005/0121676 | A1* | 6/2005 | Fried et al. .................... 257/72 |
| 2006/0044915 | A1 | 3/2006 | Park et al. |
| 2006/0234452 | A1* | 10/2006 | Lee ............................. 438/261 |
| 2006/0292781 | A1* | 12/2006 | Lee ............................. 438/197 |
| 2007/0046369 | A1* | 3/2007 | Schober et al. ................ 330/7 |
| 2007/0278576 | A1* | 12/2007 | Kim et al. .................... 257/347 |
| 2008/0164508 | A1* | 7/2008 | Jeon et al. .................... 257/315 |

OTHER PUBLICATIONS

PCT International Search Report and Written Opinion of the International Searching Authority, PCT/US07/20956 filed Sep. 28, 2007, mailed Mar. 28, 2008.
Wikipedia, The Free Encylopedia, "SONOS," <http://en.wikipedia.org/wiki/SONOS> pages viewed Aug. 2007, pages updated Jul. 2007; 3 pages.

* cited by examiner

*Primary Examiner*—Tu-Tu V Ho (57) ABSTRACT

A nonvolatile charge trap memory device and a method to form the same are described. The device includes a channel region having a channel length with <100> crystal plane orientation. The channel region is between a pair of source and drain regions and a gate stack is disposed above the channel region.

12 Claims, 7 Drawing Sheets

NONVOLATILE CHARGE TRAP MEMORY DEVICE HAVING <100> CRYSTAL PLANE CHANNEL ORIENTATION

CROSS REFERENCE TO RELATED APPLICATIONS

This application claims the benefit of U.S. Provisional Application No. 60/940,183, filed May 25, 2007, which is hereby incorporated by reference.

TECHNICAL FIELD

The invention is in the field of Semiconductor Devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device, e.g. optimizing drive current for each device, becomes increasingly significant due to power management concerns.

Figure 1A:
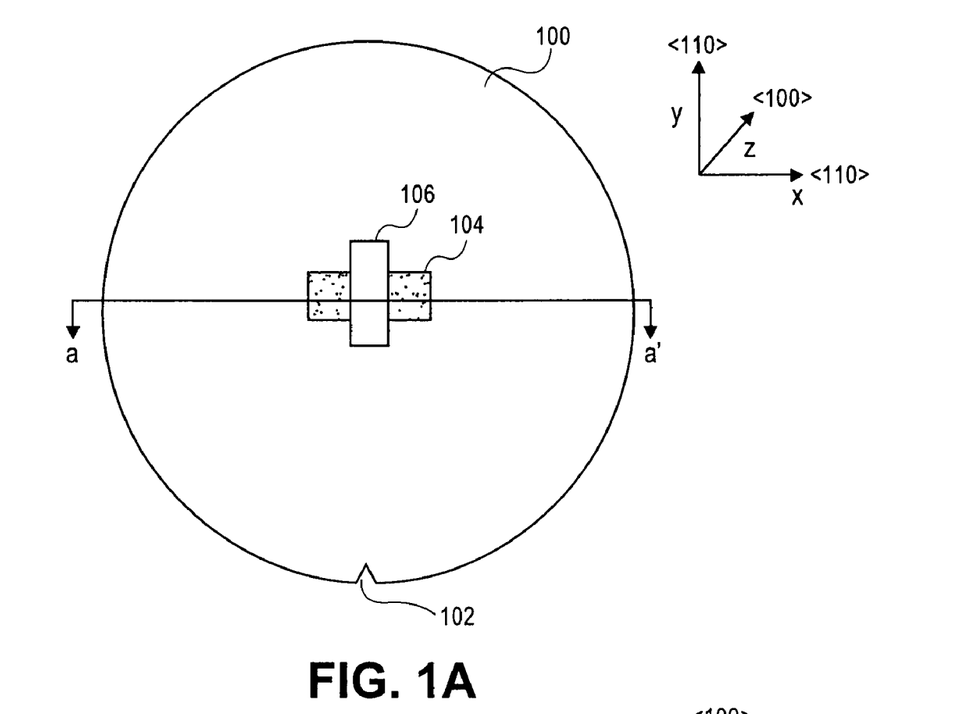
FIG. 1A illustrates a top-down view of a conventional nonvolatile charge trap memory device.
Figure 1B:
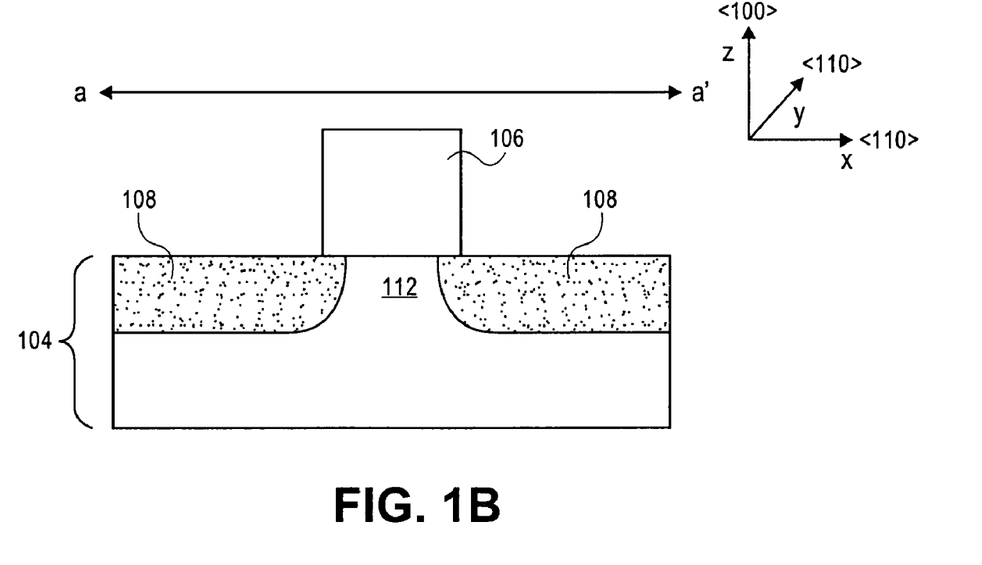
FIG. 1B illustrates a magnified cross-sectional view of a conventional nonvolatile charge trap memory device.

Nonvolatile charge trap memory devices are typically fabricated on silicon wafers having a <100> crystal plane orientation orthogonal to the surface of the wafer. FIGS. 1A-B illustrate a top-down view and a magnified cross-sectional view, respectively, of a conventional nonvolatile charge trap memory device.

Referring to FIG. 1A, a silicon wafer 100 has a <100> crystal plane orientation orthogonal to the surface of the wafer (i.e. <100> orientation in the z-direction). A notch 102 is cut into silicon wafer 100 to provide an alignment mark during semiconductor processing. Conventional silicon wafers, such as silicon wafer 100, incorporate a notch oriented with the <110> crystal plane. That is, notch 102 is oriented to provide <110> orientation in both the x- and the y-directions. Semiconductor devices are typically fabricated along either the x- or the y-direction and thus have channel regions having channel lengths with <110> crystal plane orientation. For example, referring again to FIG. 1A, an active region 104 is formed in silicon wafer 100 and is oriented along the x-direction. A gate stack 106 is oriented along the y-direction and overlaps active region 104, forming a semiconductor device.

FIG. 1B is a magnified cross-sectional view of the semiconductor device of FIG. 1A taken along the a-a' axis, i.e. the <100> z-direction is now shown in the plane of the paper. Referring to FIG. 1B, source and drain regions 108 are formed in active region 104 on either side of gate stack 106. A channel region 112 is thus defined in active region 104, in between source and drain regions 108 and underneath gate stack 106. Channel region 112, which has a channel length along the x-direction between source and drain regions 108, has <110> crystal plane orientation along the channel length as a result of the orientation of gate stack 106 with active region 104. However, a <110> crystal plane orientation for channel region 112 may not be optimal for a semiconductor device that incorporates channel region 112.

DETAILED DESCRIPTION

A nonvolatile charge trap memory device and a method to form the same is described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the Figures are illustrative representations and are not necessarily drawn to scale.

Disclosed herein is a nonvolatile charge trap memory device. The device may include a channel region having a channel length with <100> crystal plane orientation. In an embodiment, the channel region having a channel length with <100> crystal plane orientation is between a pair of source and drain regions. Furthermore, a gate stack is disposed above the channel region. A method of forming a nonvolatile charge trap memory device is also disclosed. In an embodiment, an isolation region and an active region are first formed in a substrate, wherein the active region is adjacent to the isolation region. A gate stack may next be formed above the active region. In one embodiment, a pair of source and drain regions is then formed in the active region and on the other side of the gate stack to provide a channel region in the active region, wherein the channel region has a channel length with <100> crystal plane orientation.

A nonvolatile charge trap memory device including a channel region having a channel length with <100> crystal plane orientation may improve the device performance as compared with a device including a channel region having a channel length with <110> crystal plane orientation. In accordance with an embodiment of the present invention, the drive current of a nonvolatile charge trap memory device having <100> crystal plane channel orientation demonstrates an increased drive current as compared with a counter-part device having <110> crystal plane channel orientation. The performance increase of a nonvolatile charge trap memory device having <100> crystal plane channel orientation may result from a reduced stress on the channel region as induced by a nearby isolation structure. In one embodiment, the stress induced by an isolation structure is mitigated by the formation of a uniform liner oxide layer in the isolation structure. Additionally, the performance increase of a nonvolatile charge trap memory device having <100> crystal plane channel orientation may result from a reduction in detrimental impact of the actual stress induced by a nearby isolation structure. In one embodiment, the stress induced by an isolation structure is less detrimental to a nonvolatile charge trap memory device including a channel region having a channel length with <100> crystal plane orientation than a device including a channel region having a channel length with <110> crystal plane orientation. The variability and the reliability of a nonvolatile charge trap memory device including a channel region having a channel length with <100> crystal plane orientation may be improved by uniform tunnel oxide growth on such a channel region. In accordance with an embodiment of the present invention, the growth rate of a tunnel oxide for a nonvolatile charge trap memory device including a channel region having a channel length with <100> crystal plane orientation is uniform on both the top surface and the sidewalls of the channel region, lending to improved reliability.

Figure 2A:
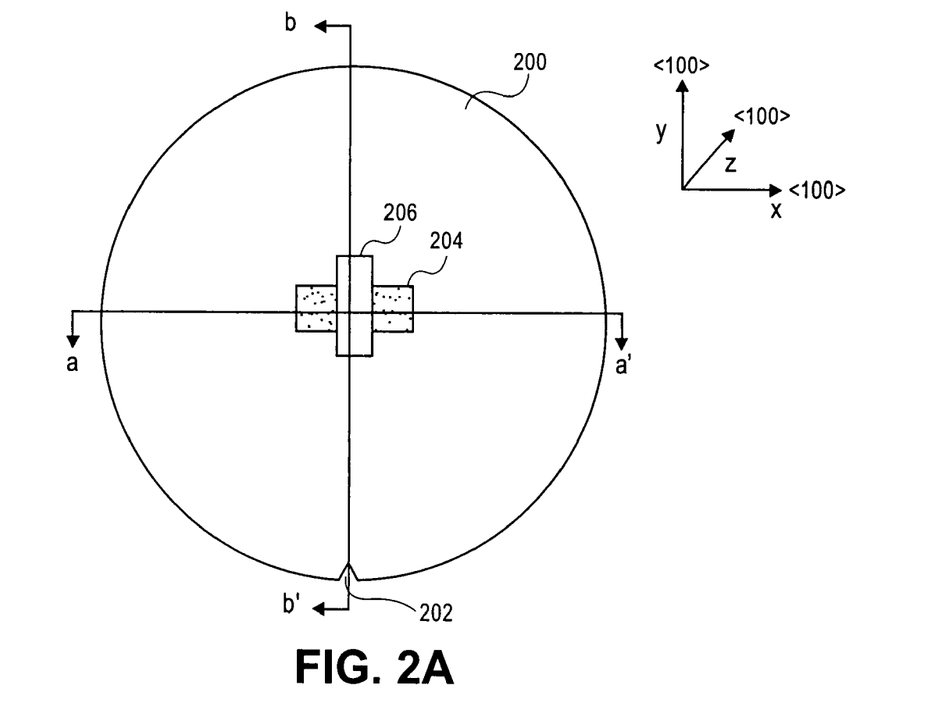
FIG. 2A illustrates a top-down view of a nonvolatile charge trap memory device, in accordance with an embodiment of the present invention.
Figure 2B:
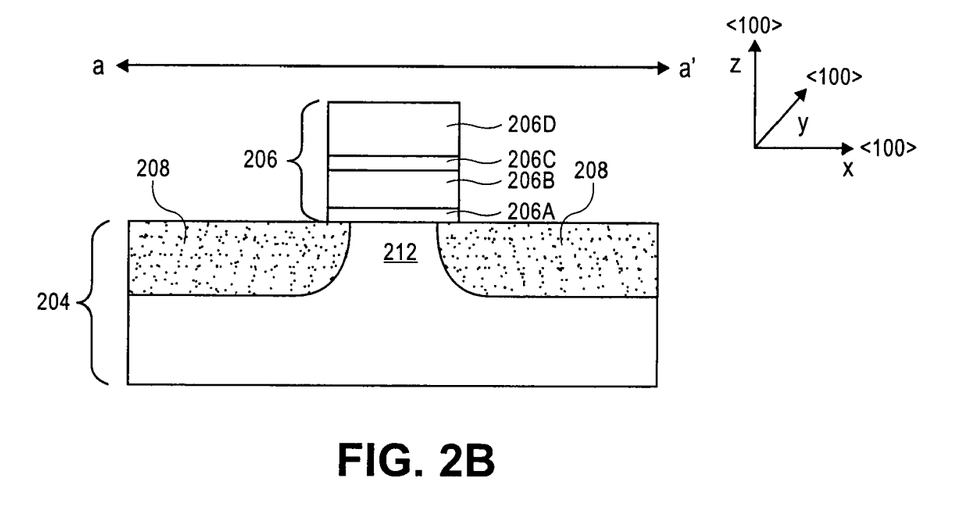
FIG. 2B illustrates a magnified cross-sectional view of a nonvolatile charge trap memory device, in accordance with an embodiment of the present invention.

A nonvolatile charge trap memory device may be fabricated to include a channel region having a channel length with <100> crystal plane orientation. FIGS. 2A-B illustrate a top-down view and a magnified cross-sectional view, respectively, of a nonvolatile charge trap memory device, in accordance with an embodiment of the present invention.

Referring to FIG. 2A, a substrate 200 has <100> crystal plane orientation orthogonal to the surface of the substrate (i.e. <100> orientation in the z-direction). An active region 204 is formed in substrate 200 and is oriented along a first <100> crystal plane (i.e. <100> orientation in the x-direction). A gate stack 206 is oriented along a second <100> crystal plane (i.e. <100> orientation in the y-direction) and overlaps active region 204, forming a semiconductor device.

The semiconductor device formed by gate stack 206 and active region 204 in substrate 200 may be any nonvolatile charge trap memory device. In accordance with an embodiment of the present invention, the semiconductor device is a SONOS-type device wherein the charge-trapping layer is an insulator layer. In another embodiment, the semiconductor device is a Flash-type device wherein the charge-trapping layer is a conductor layer or a semiconductor layer.

Substrate 200 may be composed of any material suitable for semiconductor device fabrication. In one embodiment, substrate 200 is a bulk substrate composed of a single crystal of a material which may include, but is not limited to, silicon, germanium, silicon-germanium or a III-V compound semiconductor material. In another embodiment, substrate 200 is composed of a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 200 includes a top epitaxial layer on a middle insulator layer which is above a lower bulk layer. The top epitaxial layer is composed of a single crystal layer which may include, but is not limited to, silicon, i.e. to form a silicon-on-insulator (SOI) semiconductor substrate, germanium, silicon-germanium and a III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, a III-V compound semiconductor material and quartz.

Substrate 200 may be in the form of a wafer, as depicted in FIG. 2A. In accordance with an embodiment of the present invention, a notch 202 is cut into substrate 200 to provide an alignment mark on the wafer during semiconductor processing. In one embodiment, notch 202 is oriented with two <100> crystal planes. That is, notch 202 is oriented to provide <100> orientation in both the x- and the y-directions. In a specific embodiment, a semiconductor device is fabricated along either the x- or the y-direction and thus has channel regions having channel lengths with <100> crystal plane orientation. In an alternative embodiment, a notch is conventionally aligned to <110> crystal planes, but the wafer is processed along the <100> crystal planes (i.e. the wafer is processed with a 45 degree rotation away from the notch).

FIG. 2B is a magnified cross-sectional view of the semiconductor device of FIG. 2A taken along the a-a' axis. Referring to FIG. 2B, the semiconductor device includes source and drain regions 208 formed in active region 204 on either side of gate stack 206. A channel region 212 is thus defined in active region 204, in between source and drain regions 208 and underneath gate stack 206. Channel region 212, which has a channel length along the x-direction between source and drain regions 208, has <100> crystal plane orientation along the channel length as a result of the orientation of gate stack 206 with active region 204.

Source and drain regions 208 in active region 204 may be any regions having opposite conductivity to channel region 212. For example, in accordance with an embodiment of the present invention, source and drain regions 208 have an N-type conductivity while channel region 212 has a P-type conductivity. In one embodiment, substrate 200 and, hence, active region 204 and channel region 212, is composed of boron-doped single-crystal silicon having a boron concentration in the range of $1 \times 10^{15}$-$1 \times 10^{19}$ atoms/cm3. Source and drain regions 208 are composed of phosphorous- or arsenic-doped regions having a concentration of N-type dopants in the range of $5 \times 10^{16}$-$5 \times 10^{19}$ atoms/cm3. In a specific embodiment, source and drain regions 208 have a depth in active region 204 in the range of 80-200 nanometers. In accordance with an alternative embodiment of the present invention, source and drain regions 208 are P-type doped regions while channel region 212 is an N-type doped region.

Gate stack 206 may be any gate stack suitable for use in a nonvolatile charged trap memory device. For example, in accordance with an embodiment of the present invention, gate stack 206 includes a tunnel dielectric layer 206A a charge-trapping layer 206B, a top dielectric layer 206C and a gate layer 206D, as depicted in FIG. 2B. In one embodiment, the semiconductor device is a SONOS-type device and charge-trapping layer 206B is a dielectric layer. In an alternative embodiment, the semiconductor device is a Flash-type device and charge-trapping layer 206B is a semiconductor layer or a conductor layer.

As described above, the semiconductor device may be a SONOS-type nonvolatile charge trap memory device. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. A SONOS-type device, however, is not limited to these specific materials, as described below. In accordance with an embodiment of the present invention, the channel region material in a SONOS-type device is any material suitable to conduct charge carriers at a suitable rate, i.e. with a suitable mobility, when the device is in an ON-state. Thus, in one embodiment, channel region 212 is composed of any material described in association with substrate 200 from FIG. 2A. In a specific embodiment, channel region 212 is doped P-type and, in an alternative embodiment, channel region 212 is doped N-type.

The tunnel dielectric layer may be any material and have any thickness suitable to allow charge carriers to tunnel into the charge-trapping layer under an applied gate bias while maintaining a suitable barrier to leakage when the device is unbiased. In one embodiment, tunnel dielectric layer 206A is formed by a thermal oxidation process and is composed of silicon dioxide or silicon oxy-nitride. In another embodiment, tunnel dielectric layer 206A is formed by chemical vapor deposition or atomic layer deposition and is composed of a high-k dielectric layer which may include, but is not limited to, hafnium oxide, zirconium oxide, hafnium silicate, hafnium oxy-nitride, hafnium zirconium oxide and lanthanum oxide. In a specific embodiment, tunnel dielectric layer 206A has a thickness in the range of 1-10 nanometers. In a particular embodiment, tunnel dielectric layer 206A has a thickness of approximately 2 nanometers.

The charge-trapping dielectric layer may be any material and have any thickness suitable to store charge and, hence, raise the threshold voltage of gate stack 206. In accordance with an embodiment of the present invention, charge-trapping layer 206B is formed by a chemical vapor deposition process and is composed of a dielectric material which may include, but is not limited to, stoichiometric silicon nitride, silicon-rich silicon nitride and silicon oxy-nitride. In one embodiment, charge-trapping layer 206B has a graded composition. In a specific embodiment, charge-trapping layer 206B has a thickness in the range of 5-10 nanometers.

The top dielectric layer may be any material and have any thickness suitable to maintain a barrier to charge leakage without significantly decreasing the capacitance of gate stack 206. In one embodiment, top dielectric layer 206C is formed by a chemical vapor deposition process and is composed of silicon dioxide or silicon oxy-nitride. In another embodiment, top dielectric layer 206C is formed by atomic layer deposition and is composed of a high-k dielectric layer which may include, but is not limited to, hafnium oxide, zirconium oxide, hafnium silicate, hafnium oxy-nitride, hafnium zirconium oxide and lanthanum oxide. In a specific embodiment, top dielectric layer 206C has a thickness in the range of 1-20 nanometers.

The gate layer may be composed of any conductor or semiconductor material suitable for accommodating a bias during operation of a SONOS-type transistor. In accordance with an embodiment of the present invention, gate layer 206D is formed by a chemical vapor deposition process and is composed of in situ- or post-doped poly-crystalline silicon. In another embodiment, gate layer 206D is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel.

Figure 3:
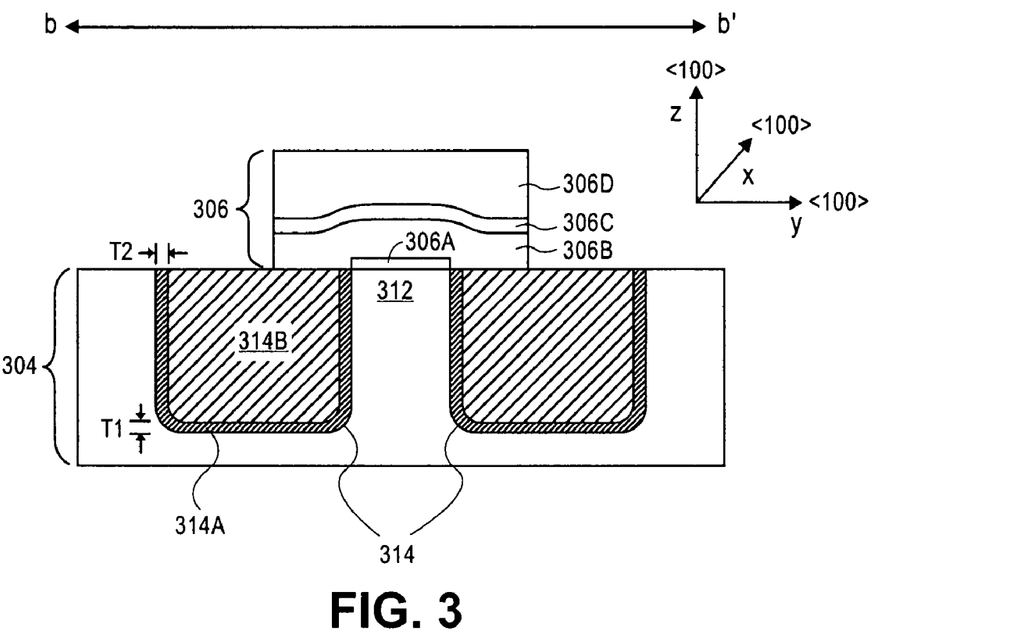
FIG. 3 illustrates a cross-sectional view of a nonvolatile charge trap memory device, in accordance with an embodiment of the present invention.

A nonvolatile charge trap memory device including a channel region having a channel length with <100> crystal plane orientation may be adjacent an isolation structure having a uniform liner oxide layer. FIG. 3 illustrates a cross-sectional view of a nonvolatile charge trap memory device, in accordance with an embodiment of the present invention.

Referring to FIG. 3, a nonvolatile charge trap memory device has a channel region 312 formed in an active region 304, wherein a gate stack 306 resides above channel region 312. Gate stack 306 (and, hence, tunnel dielectric layer 306A, charge-trapping dielectric layer 306B, top dielectric layer 306C and gate layer 306D) and active region 304 (and, hence, channel region 312) may be composed of any of the materials and have any of the characteristics as those described in association with gate stack 206 and active region 204 from FIGS. 2A-B.

In contrast to FIG. 2B, the cross-sectional view of FIG. 3 is taken along the y-axis of channel region 312, i.e. along the b-b' axis shown in FIG. 2A. Thus, the source and drain regions are not shown (they would be into and out of the page along the x-axis). Nonetheless, the orientation of the crystal plane of channel region 312 is also <100> in the y-direction. Furthermore, from this perspective, isolation structures 314 can be viewed on either side of channel region 312, as depicted in FIG. 3. Isolation structures 314 include a liner oxide 314A and a fill dielectric layer 314B.

Liner oxide 314A of isolation structure 314 may be composed of any dielectric material suitable to provide robust adhesion between active region 304 and fill dielectric layer 314B. In accordance with an embodiment of the present invention, liner oxide 314A is formed by thermally oxidizing the material of active region 304. For example, in one embodiment, active region 304 is composed of silicon and is thermally oxidized at a temperature of approximately 1000 degrees Celsius. Liner oxide 314A may have a thickness that is substantially uniform. In one embodiment, the thickness of liner oxide 314A at the bottom of isolation structure 314 (T1) is substantially equal to the thickness of liner oxide 314A on the sidewalls of isolation structure 314 (T2). In a specific embodiment, the thickness of liner oxide 314A at the bottom of isolation structure 314 is in the range of 0.95-1.05 times the thickness of liner oxide 314A on the sidewalls of isolation structure 314. In a particular embodiment, the thickness of liner oxide 314A is in the range of 10-20 nanometers.

By forming a nonvolatile charge trap memory device including a channel region having a channel length with <100> crystal plane orientation, liner oxide 314A may be more uniform in thickness than a liner oxide formed for a nonvolatile charge trap memory device including a channel region having a channel length with <110> crystal plane orientation. For example, in accordance with an embodiment of the present invention, the orientation of the crystal plane of active region 304 is <100> at the bottom of isolation structure 314 (i.e. along the z-axis) as well as at the sidewalls of isolation structure 314 (i.e. along the y-axis). Thus, in one embodiment, a thermal oxidation of active region 304 to form liner oxide 314A provides substantially the same growth rate along the sidewalls and the bottom of isolation structure 314. By contrast, liner oxide formation for a nonvolatile charge trap memory device including a channel region having a channel length with <110> crystal plane orientation has different growth rates along the <110> y-direction versus the <100> z-direction. The differential in growth rates for a liner oxide in a nonvolatile charge trap memory device including a channel region having a channel length with <110> crystal plane orientation can lead to a non-uniform liner oxide. A non-uniform liner oxide may cause detrimental stress to the channel region of a nonvolatile charge trap memory device incorporating an isolation structure having such a non-uniform liner oxide. Thus, in accordance with an embodiment of the present invention, the stress induced by an isolation structure of a nonvolatile charge trap memory device including a channel region having a channel length with <100> crystal plane orientation is reduced by forming a uniform liner oxide layer in the isolation structure.

Fill dielectric layer 314B may be composed of any dielectric material suitable to provide electrical isolation between adjacent semiconductor devices. In accordance with an embodiment of the present invention, fill dielectric layer 314B is formed by a chemical vapor deposition process. In one embodiment, fill dielectric layer 314B is composed of silicon dioxide deposited by an organo-silane precursor. Fill dielectric layer 314B may induce a compressive stress against channel region 312. In the case of a nonvolatile charge trap memory device including a channel region having a channel length with <110> crystal plane orientation, such a compressive stress may be detrimental to the performance of the device. However, such a compressive stress may be less detrimental to a nonvolatile charge trap memory device including a channel region having a channel length with <100> crystal plane orientation. Thus, in accordance with an embodiment of the present invention, the performance of a device formed with a channel region having a channel length with <100> crystal plane orientation is increased due to a lower impact of stress induced by an isolation structure to a nonvolatile charge trap memory device including a channel region having a channel length with <100> crystal plane orientation as compared to a device including a channel region having a channel length with <110> crystal plane orientation.

Figure 4:
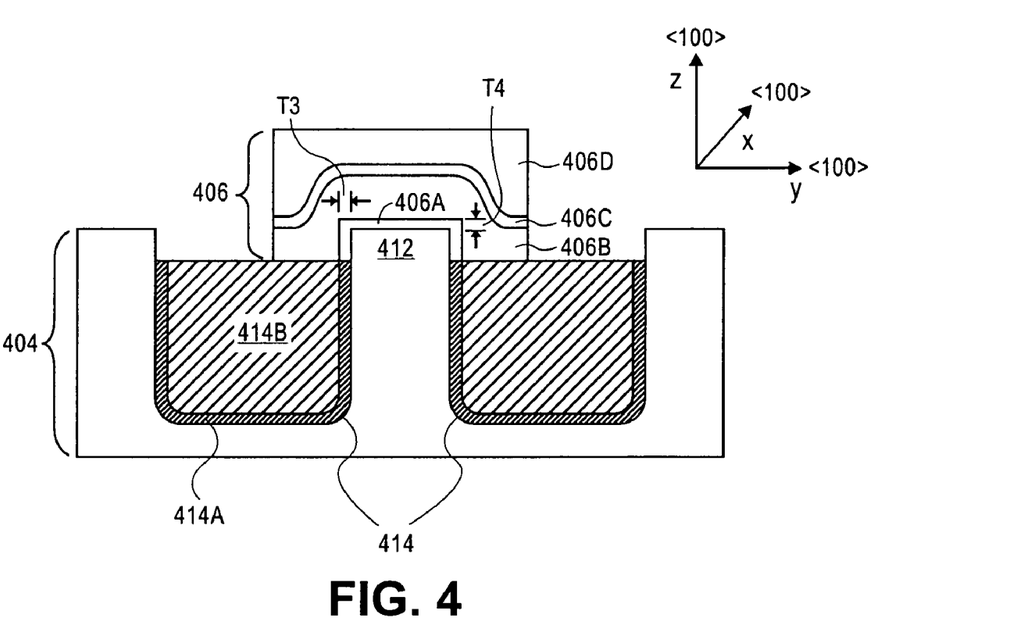
FIG. 4 illustrates a cross-sectional view of a nonvolatile charge trap memory device, in accordance with an embodiment of the present invention.

A nonvolatile charge trap memory device including a channel region having a channel length with <100> crystal plane orientation may be adjacent to an isolation structure having a top surface below the top surface of the channel region. FIG. 4 illustrates a cross-sectional view of a nonvolatile charge trap memory device, in accordance with an embodiment of the present invention.

Referring to FIG. 4, a nonvolatile charge trap memory device has a channel region 412 formed in an active region 404, wherein a gate stack 406 resides above channel region 412. Gate stack 406 (and, hence, tunnel dielectric layer 406A, charge-trapping dielectric layer 406B, top dielectric layer 406C and gate layer 406D) and active region 404 (and, hence, channel region 412) may be composed of any of the materials and have any of the characteristics as those described in association with gate stack 206 and active region 204 from FIGS. 2A-B.

As in FIG. 3, the cross-sectional view of FIG. 4 is taken along the y-axis of channel region 412, i.e. along the b-b' axis shown in FIG. 2A. Thus, the source and drain regions are not shown (they would be into and out of the page along the x-axis). Nonetheless, the orientation of the crystal plane of channel region 412 is also <100> in the y-direction. Furthermore, from this perspective, isolation structures 414 can be viewed on either side of channel region 412, as depicted in FIG. 4. The isolation structures 414 include a liner oxide 414A and a fill dielectric layer 414B. Referring again to FIG. 4, in accordance with another embodiment of the present invention, the top surfaces of isolation structures 414 are below the top surface of channel region 412. Thus, in addition to gate stack 406 being in contact with the top surface of channel region 412, gate stack 406 is also in contact with the sidewalls of channel region 412. That is, in one embodiment, tunnel dielectric layer 406A is formed on both the top surface and the exposed portions of the sidewalls of channel region 412.

Tunnel dielectric layer 406A may be formed by a thermal oxidation process wherein the material of active region 404 is oxidized by heating in an oxygen-containing atmosphere. By forming a nonvolatile charge trap memory device including a channel region having a channel length with <100> crystal plane orientation, tunnel dielectric layer 406A may be more uniform in thickness than a tunnel dielectric layer formed for a nonvolatile charge trap memory device including a channel region having a channel length with <110> crystal plane orientation. For example, in accordance with an embodiment of the present invention, the orientation of the crystal plane of active region 404 is <100> at the top of channel region 412 (i.e. along the z-axis) as well as at the exposed sidewalls of channel region 412 (i.e. along the y-axis). Thus, in one embodiment, a thermal oxidation of active region 404 to form tunnel dielectric layer 406A provides substantially the same growth rate along the y-direction and the z-direction, i.e. along the sidewall (T3) and along the top surface (T4) of channel region 412. By contrast, tunnel dielectric layer formation for a nonvolatile charge trap memory device including a channel region having a channel length with <110> crystal plane orientation has different growth rates along the <110> y-direction versus the <100> z-direction. The differential growth rates for a tunnel dielectric layer in a nonvolatile charge trap memory device including a channel region having a channel length with <110> crystal plane orientation can form a non-uniform tunnel dielectric layer. A non-uniform tunnel dielectric layer may cause undesirable device-to-device variations and detriment to the reliability of a nonvolatile charge trap memory device incorporating such a non-uniform tunnel dielectric layer. Thus, in accordance with an embodiment of the present invention, the growth rate of a tunnel oxide in a nonvolatile charge trap memory device including a channel region having a channel length with <100> crystal plane orientation is uniform on both the top surface and the sidewalls of the channel region, lending to reduced variations and improved reliability.

A nonvolatile charge trap memory device may be fabricated to include a channel region having a channel length with <100> crystal plane orientation. FIGS. 5A-I illustrate cross-sectional views representing steps in the formation of a nonvolatile charge trap memory device, in accordance with an embodiment of the present invention.

Figure 5A:
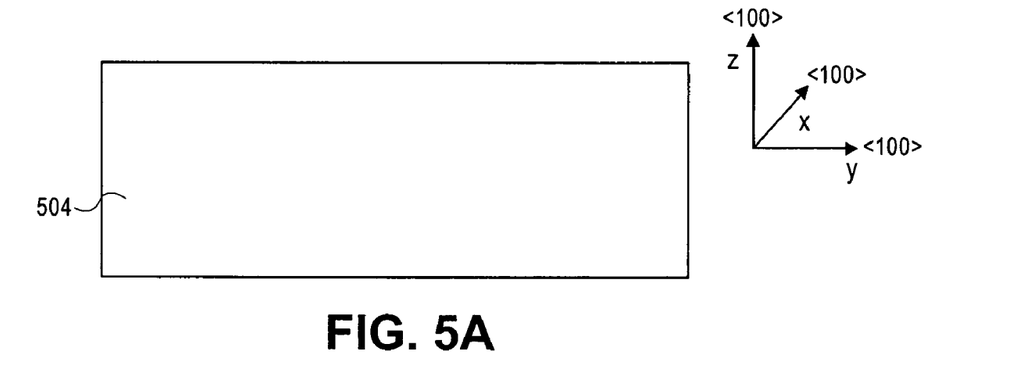
FIG. 5A illustrates a cross-sectional view representing a step in the formation of a nonvolatile charge trap memory device, in accordance with an embodiment of the present invention.

Referring to FIG. 5A, an active region 504 of a substrate is aligned to have <100> crystal plane orientation in the x-, y- and z-directions. Active region 504 may be composed of any material and have any characteristics described in association with active region 204 from FIGS. 2A-B.

Figure 5B:
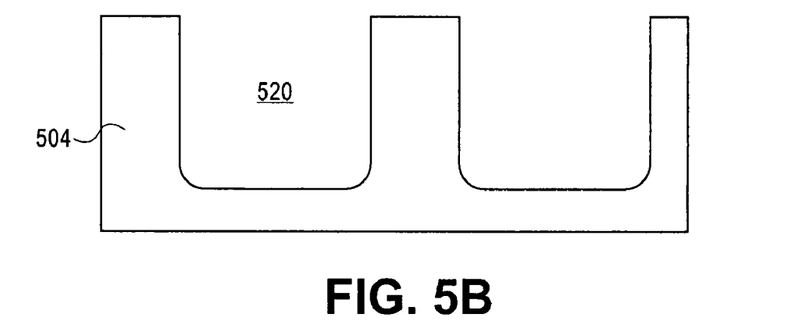
FIG. 5B illustrates a cross-sectional view representing a step in the formation of a nonvolatile charge trap memory device, in accordance with an embodiment of the present invention.

Referring to FIG. 5B, trenches 520 are formed in active region 504. Trenches 520 will ultimately provide a location for the formation of isolation structures for a nonvolatile charge trap memory device. In accordance with an embodiment of the present invention, the bottom of trenches 520 exhibit the crystal orientation of the z-direction, i.e. the bottom of trenches 520 have <100> crystal orientation. The sidewalls of trenches 520 have the crystal orientation of the y-direction, i.e. the sidewalls of trenches 520 also have <100> crystal orientation. Thus, in one embodiment, a substantial portion of the exposed surfaces of trenches 520 have <100> crystal orientation.

Trenches 520 may be formed by any process suitable to selectively remove a portion of active region 504. For example, in accordance with an embodiment of the present invention, trenches 520 are formed by etching using an anisotropic dry etch process. In one embodiment, active region 504 is composed substantially of silicon and a dry etch process utilizes gases which may include, but are not limited to, carbon tetrafluoride ($CF_4$), oxygen ($O_2$), hydrogen bromide (HBr) and chlorine ($Cl_2$). In accordance with an alternative embodiment of the present invention, trenches 520 are formed by etching using an isotropic dry etch process. In one embodiment, active region 504 is composed substantially of silicon and a dry etch process utilizes gases which may include, but are not limited to, sulfur hexafluoride ($SF_6$) and nitrogen trifluoride ($NF_3$). Trenches 520 may be formed to a depth suitable to inhibit cross-talk between neighboring devices. In one embodiment, trenches 520 are formed to a depth in the range of 100-400 nanometers.

Figure 5C:
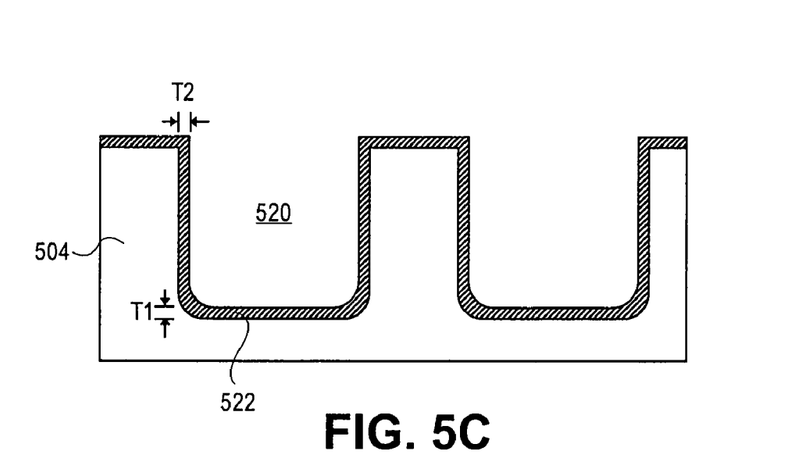
FIG. 5C illustrates a cross-sectional view representing a step in the formation of a nonvolatile charge trap memory device, in accordance with an embodiment of the present invention.

Referring to FIG. 5C, a liner oxide film 522 is formed on the exposed surfaces of active region 504 having trenches 520. Liner oxide film 522 may be formed from any material, by any process, and have any dimensions as those described in association with liner oxide 314A from FIG. 3. In accordance with an embodiment of the present invention, the thickness of liner oxide film 522 at the bottom (T1) and at the sidewalls (T2) of trenches 520 is substantially the same.

Figure 5D:
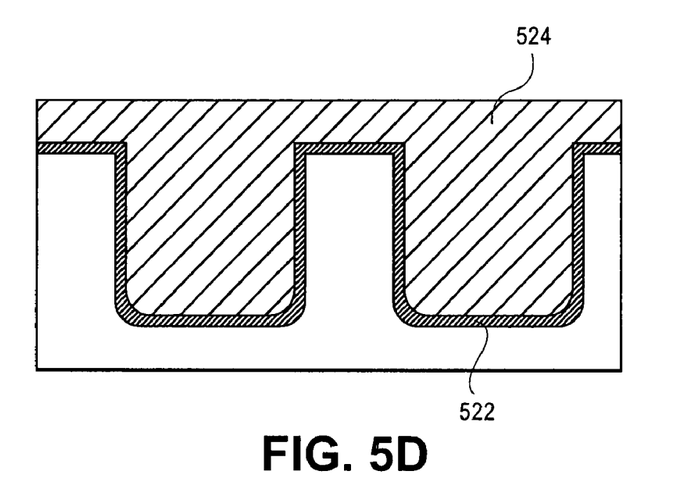
FIG. 5D illustrates a cross-sectional view representing a step in the formation of a nonvolatile charge trap memory device, in accordance with an embodiment of the present invention.
Figure 5E:
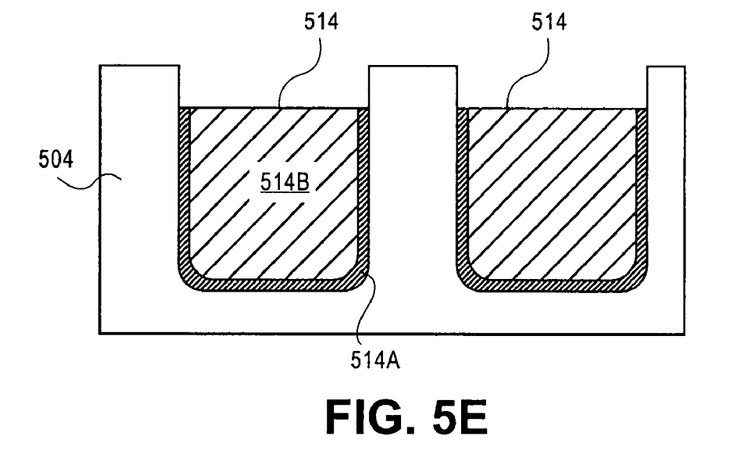
FIG. 5E illustrates a cross-sectional view representing a step in the formation of a nonvolatile charge trap memory device, in accordance with an embodiment of the present invention.

Referring to FIG. 5D, a fill dielectric material 524 is deposited into trenches 520 and above the top surface of active region 504. Fill dielectric material 524 may be formed from any material, by any process, and have any dimensions as those described in association with fill dielectric layer 314B from FIG. 3. Next, the portions of fill dielectric material 524 and liner oxide film 522 that are above the top surface of active region 504 are removed to form isolation structures 514 including liner oxide 514A and fill dielectric layer 514B, as depicted in FIG. 5E. The portions of fill dielectric material 524 and liner oxide film 522 that are above the top surface of active region 504 may be removed by any process suitable to provide substantially flat top surfaces for resulting isolation structures 514 with high selectivity to the top surface of active region 504. In one embodiment, the portions of fill dielectric material 524 and liner oxide film 522 that are above the top surface of active region 504 are removed by a chemical-mechanical polishing step. In accordance with an embodiment of the present invention, the top surfaces of isolation structures 514 are below the top surface of active region 504, as depicted in FIG. 5E.

Figure 5F:
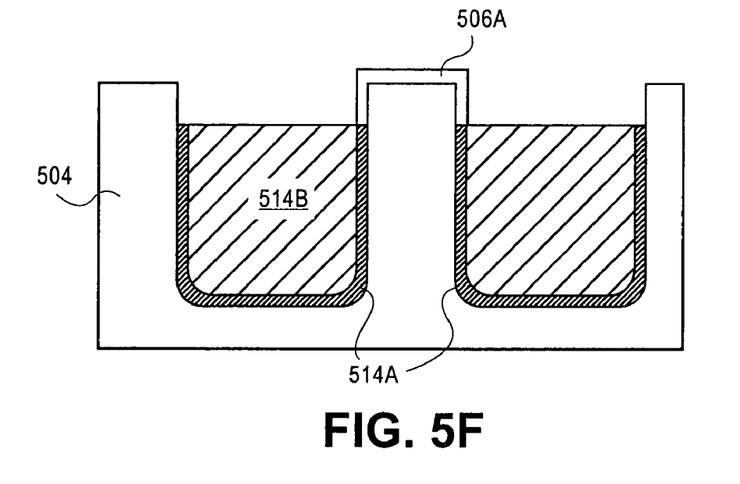
FIG. 5F illustrates a cross-sectional view representing a step in the formation of a nonvolatile charge trap memory device, in accordance with an embodiment of the present invention.

Referring to FIG. 5F, a tunnel dielectric layer 506A is formed on the exposed portions of active region 504 between isolation structures 514. Tunnel dielectric layer may be formed from any material, by any process, and have any dimensions as those described in association with tunnel dielectric layer 206A from FIGS. 2A-B. In accordance with an embodiment of the present invention, tunnel dielectric layer 506A has both a top surface portion and sidewall portions, as depicted in FIG. 5F.

Figure 5G:
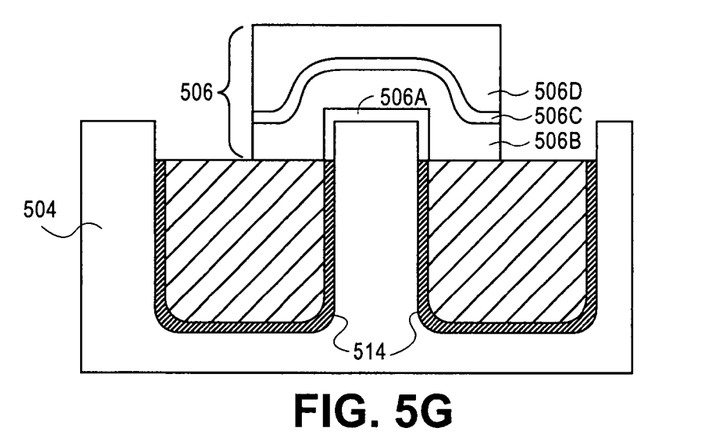
FIG. 5G illustrates a cross-sectional view representing a step in the formation of a nonvolatile charge trap memory device, in accordance with an embodiment of the present invention.

Referring to FIG. 5G, a gate stack 506 incorporating tunnel dielectric layer 506A is formed. Gate stack 506 (and, hence, charge-trapping layer 506B, top dielectric layer 506C and gate layer 506D) may be formed from any material, by any process, and have any dimensions as those described in association with gate stack 206 from FIGS. 2A-B.

Figure 5H:
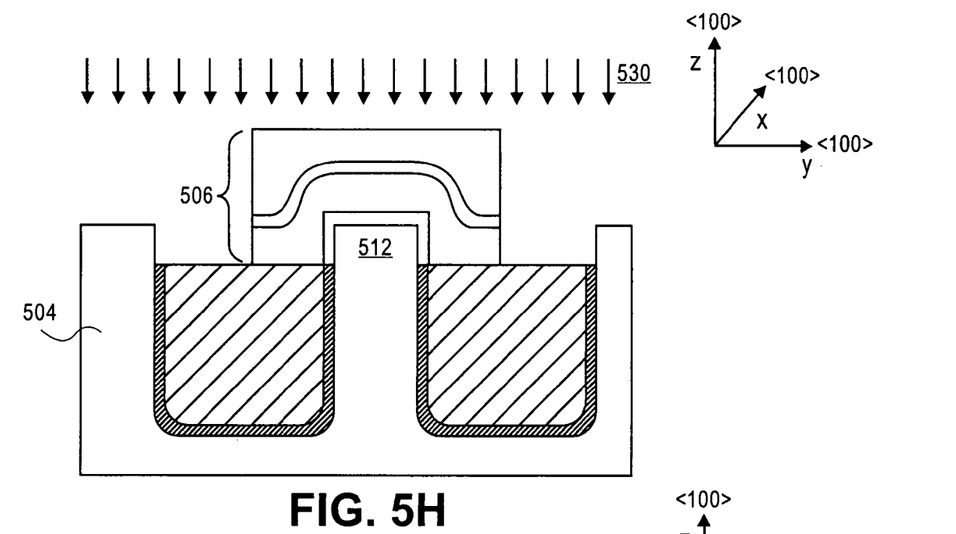
FIG. 5H illustrates a cross-sectional view representing a step in the formation of a nonvolatile charge trap memory device, in accordance with an embodiment of the present invention.
Figure 5I:
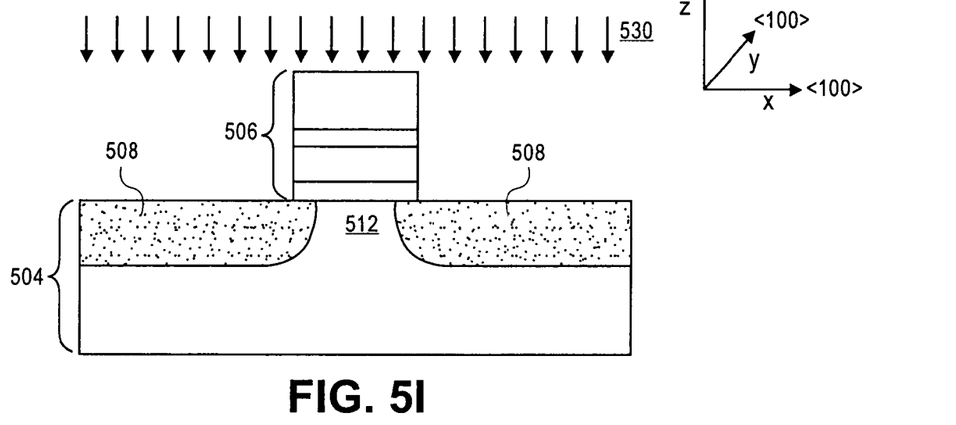
FIG. 5I illustrates a cross-sectional view representing a step in the formation of a nonvolatile charge trap memory device, in accordance with an embodiment of the present invention.

Finally, dopant impurity atoms 530 are implanted into the exposed portions of active region 504 to form source and drain regions 508, as depicted in FIGS. 5H and 5I. Source and drain regions 508 may have any characteristics as those described in association with source and drain regions 208 from FIGS. 2A-B. FIG. 5I is a cross-section taken orthogonally to the cross-section illustrated in FIG. 5H. Thus, source and drain regions 508 are not shown in FIG. 5H, but are shown along the x-direction illustrated in FIG. 5I. Referring to both FIGS. 5H and 5I, source and drain regions 508 define a channel region 512 in active region 504. In accordance with an embodiment of the present invention, channel region 512 has <100> crystal plane orientation in the x-direction (i.e. between source and drain regions 508), as depicted in FIG. 5I. In a specific embodiment, channel region 512 also has <100> crystal plane orientation in the y-direction (i.e. between isolation structures 514), as depicted in FIG. 5H.

Figure 6:
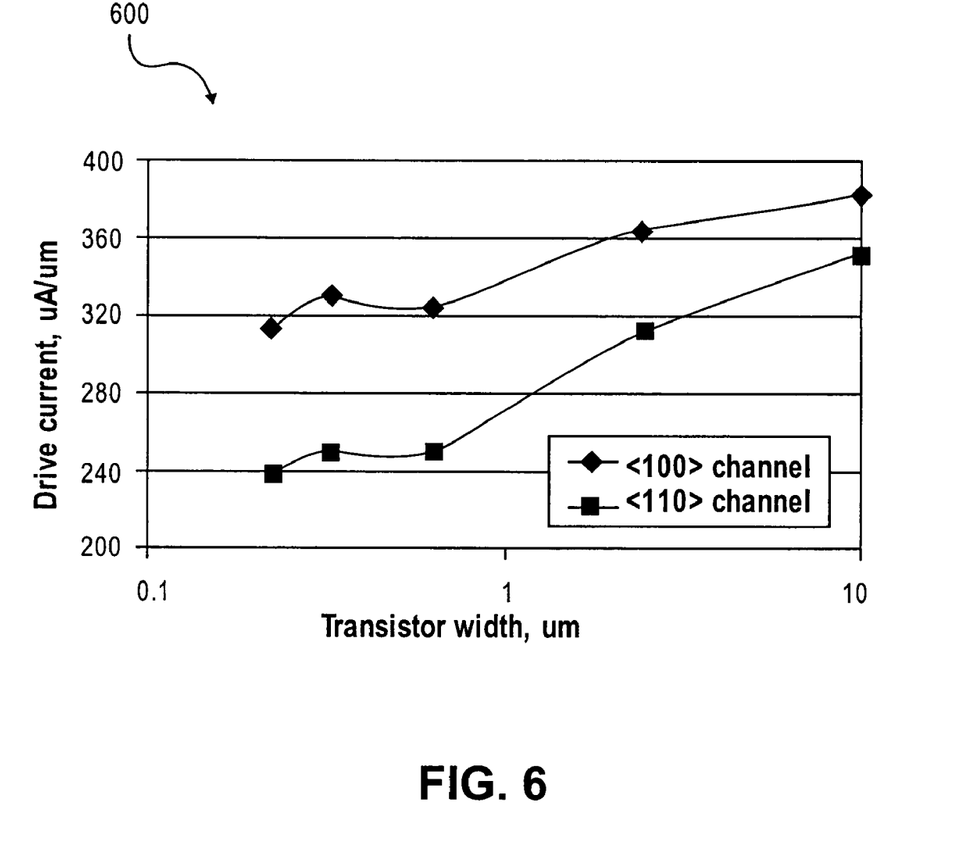
FIG. 6 is a plot 600 of drive current as a function of transistor width for a nonvolatile charge trap memory device having <100> crystal plane channel orientation compared with a nonvolatile charge trap memory device having <110> crystal plane channel orientation, in accordance with an embodiment of the present invention.

The performance of a nonvolatile charge trap memory device including a channel region having a channel length with <100> crystal plane orientation may be greater than that of a nonvolatile charge trap memory device including a channel region having a channel length with <110> crystal plane orientation. FIG. 6 is a plot 600 of drive current as a function of transistor width for a nonvolatile charge trap memory device having <100> crystal plane channel orientation compared with a nonvolatile charge trap memory device having <110> crystal plane channel orientation, in accordance with an embodiment of the present invention. As shown in plot 600, for transistor widths in the range of approximately 0.2-10 microns, the drive current of a device having <100> crystal plane channel orientation is greater than its counter-part device having <110> crystal plane channel orientation.

Thus, a nonvolatile charge trap memory device has been disclosed. The device includes a channel region having a channel length with <100> crystal plane orientation. In an embodiment, the channel region is between a pair of source and drain regions and a gate stack resides above the channel region. A method of forming a nonvolatile charge trap memory device is also disclosed. In an embodiment, an isolation region and an active region are first formed in a substrate, wherein the active region is adjacent to the isolation region. A gate stack is then formed above the active region. Finally, a pair of source and drain regions is formed in the active region and on other side of the gate stack to provide a channel region in the active region. The channel region has a channel length with <100> crystal plane orientation.

What is claimed is:

1. An N-channel nonvolatile charge trap memory device, comprising:
    a source region and a drain region formed in a P-type active region, wherein the source and drain region are of N-type conductivity;
    an N-type channel region having a channel length with <100> crystal plane orientation between the source region and the drain region; and
    a gate stack disposed above the channel region, the gate stack comprising a charge-trapping layer with a graded composition, wherein the gate stack further comprises a tunnel dielectric layer with substantially the same tunnel oxide thickness along the sidewall and top surface of the N-type channel region.

2. The nonvolatile charge trap memory device of claim 1, wherein the gate stack is a SONOS-type gate stack.

3. The nonvolatile charge trap memory device of claim 1, wherein the active region comprises silicon.

4. The nonvolatile charge trap memory device of claim 1, wherein the charge-trapping layer is a dielectric layer.

5. An N-channel nonvolatile charge trap memory device, comprising:
    an isolation structure formed in a substrate, the isolation structure comprising a top surface;
    a P-type active region formed in the substrate and adjacent to the isolation structure, the P-type active region comprising a top surface at a same height as the top surface of the isolation structure;
    an N-type channel region formed in the P-type active region, wherein the N-type channel region has a channel length with <100> crystal plane orientation;
    a source region and a drain region formed in the P-type active region, wherein the channel region is between the source region and the drain region, wherein the source region and drain region are of N-type conductivity; and
    a gate stack disposed above the N-type channel region, wherein the gate stack further comprises a tunnel dielectric layer with substantially the same tunnel oxide thickness along the sidewall and top surface of the N-type channel region.

6. The nonvolatile charge trap memory device of claim 5, wherein the isolation structure comprises a liner oxide having approximately equal thickness on a sidewall and a bottom surface of the isolation structure.

7. The nonvolatile charge trap memory device of claim 5, wherein the gate stack is a SONOS-type gate stack.

8. The nonvolatile charge trap memory device of claim 5, wherein the P-type active region comprises silicon.

9. The nonvolatile charge trap memory device of claim 5, wherein the gate stack comprises a dielectric charge-trapping layer.

10. A method of fabricating an N-channel nonvolatile charge trap memory device, comprising:
    forming an isolation region and P-type active region in a substrate, each having a top surface, wherein the P-type active region is adjacent to the isolation region, and wherein the top surface of the P-type active region is at a same height as the top surface of the isolation structure;
    forming a gate stack above the P-type active region; and
    forming a source region and a drain region in the P-type active region and on other side of the gate stack to provide an N-type channel region in the active region, wherein the N-type channel region has a channel length with <100> crystal plane orientation between the source region and the drain region, wherein the source region and the drain region are of N-type conductivity, wherein forming the gate stack further comprises forming a tunnel dielectric layer with substantially the same growth rate along the sidewall and top surface of the channel region.

11. The method of claim 10, wherein the gate stack is a SONOS-type gate stack.

12. The method of claim 11, wherein the P-type active region comprises silicon.

* * * * *